United States Patent
Nakagawa

(10) Patent No.: US 8,314,424 B2
(45) Date of Patent: Nov. 20, 2012

(54) THIN FILM TRANSISTOR ARRAY SUBSTRATE, DISPLAY PANEL COMPRISING THE SAME, AND METHOD FOR MANUFACTURING THIN FILM TRANSISTOR ARRAY SUBSTRATE

(75) Inventor: Hidetoshi Nakagawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 205 days.

(21) Appl. No.: 12/747,455

(22) PCT Filed: Aug. 5, 2008

(86) PCT No.: PCT/JP2008/002117
§ 371 (c)(1),
(2), (4) Date: Jun. 10, 2010

(87) PCT Pub. No.: WO2009/075045
PCT Pub. Date: Jun. 18, 2009

(65) Prior Publication Data
US 2010/0289025 A1    Nov. 18, 2010

(30) Foreign Application Priority Data
Dec. 11, 2007 (JP) ................................. 2007-320163

(51) Int. Cl.
*H01L 51/50* (2006.01)
(52) U.S. Cl. ................. 257/59; 257/E29.291; 438/149; 438/158; 438/151; 349/54
(58) Field of Classification Search .......................... None
See application file for complete search history.

(56) References Cited

U.S. PATENT DOCUMENTS

| | | | |
|---|---|---|---|
| 2001/0028418 A1* | 10/2001 | Ozaki et al. | ................. 349/54 |
| 2005/0173707 A1 | 8/2005 | Shiraki et al. | |
| 2008/0024690 A1 | 1/2008 | Hirakata et al. | |

FOREIGN PATENT DOCUMENTS

| | | |
|---|---|---|
| JP | 7-104311 A | 4/1995 |
| JP | 2002-182246 A | 6/2002 |
| JP | 2005-175109 A | 6/2005 |
| JP | 2005-250448 A | 9/2005 |
| WO | WO 2006/126460 A1 | 11/2006 |

\* cited by examiner

*Primary Examiner* — Fei Fei Yeung Lopez
(74) *Attorney, Agent, or Firm* — Birch, Stewart, Kolasch & Birch, LLP.

(57) ABSTRACT

A TFT (5) includes: a gate electrode (12*a*); a first semiconductor portion (14*a*) that overlaps the gate electrode (12*a*) having the gate insulating film (13) interposed therebetween; a source electrode (15*a*) and a drain electrode (15*b*) that overlap the gate electrode (12*a*) having the gate insulating film (13) and the first semiconductor portion (14*a*) interposed therebetween; a second semiconductor portion (14*b*) that overlaps the gate electrode (12*a*) between the gate insulating film (13) and the source electrode (15*a*); and a conductive portion (15*c*) that overlaps the gate electrode (12*a*) having the gate insulating film (13) and the second semiconductor portion (14*b*) interposed therebetween. The TFT (5) brings the source line (15*a*) and the pixel electrode (17) into conduction by a switching element that includes short-circuit portion at the source electrode (15*a*) and the drain electrode (15*b*), the second semiconductor portion (14*b*) and the conductive portion (15*c*).

12 Claims, 10 Drawing Sheets

THIN FILM TRANSISTOR ARRAY SUBSTRATE, DISPLAY PANEL COMPRISING THE SAME, AND METHOD FOR MANUFACTURING THIN FILM TRANSISTOR ARRAY SUBSTRATE

TECHNICAL FIELD

The present invention relates to a thin film transistor array substrate, a display panel comprising the same, and a method for manufacturing a thin film transistor array substrate. In particular, the present invention relates to a defect repair technique of a thin film transistor array substrate and a display panel comprising the same.

BACKGROUND ART

A thin film transistor (hereinafter referred to as a "TFT") array substrate that structures an active matrix driven type liquid crystal display panel is provided with a TFT as a switching element per pixel, which is the smallest unit of an image.

For example, a bottom-gate type TFT includes a gate electrode that is arranged on an insulating substrate, a gate insulating film that is arranged so as to cover the gate electrode, a semiconductor layer that is arranged to be island-shaped on the gate insulating film so as to overlap the gate electrode, and a source electrode and a drain electrode that are arranged on the semiconductor layer so as to oppose to each other.

Here, in connection with the liquid crystal display panel, if any conductive foreign object or film residue is interposed between the source electrode and the drain electrode in any TFT provided per pixel, a short-circuit may possibly be established at the source electrode and the drain electrode, making it impossible for the pixel to operate correctly. Accordingly, there has been proposed a TFT array substrate that is provided with a plurality of TFTs per pixel (see PATENT DOCUMENTS 1 and 2, for example).

For example, PATENT DOCUMENT 1 discloses, in FIGS. 2 to 4, an active matrix substrate that includes source lines, pixel electrodes, first TFTs that switch the electrical connection between them, and second TFTs as spares. The second TFTs each include a semiconductor film at which a source electrode and a drain electrode are formed, and a gate electrode arranged at the semiconductor film having a gate insulating film interposed therebetween. The source lines are each arranged relative to the semiconductor film of corresponding one of the second TFTs having an interlayer insulating film greater than the gate insulating film in thickness interposed therebetween. The source lines are each configured to be capable of being electrically connected to the source electrode by formation of a contact hole at the interlayer insulating film, in a situation where corresponding one of the first TFTs fails. The second TFT can carry out switching of the electrical connection between the source line and the pixel electrode.

CITATION LIST

Patent Document

PATENT DOCUMENT 1: Japanese Patent Publication No. 2005-250448
PATENT DOCUMENT 2: Japanese Patent Publication No. 2002-182246

SUMMARY OF THE INVENTION

Technical Problem

Recently, the size of a liquid crystal display panel being a constituent of a liquid crystal television set is ever increasing and, accordingly, each pixel is increased in size, measuring about 0.6 mm long and about 0.2 mm wide, for example. Therefore, when a defect occurs by a short-circuit established at the source electrode and the drain electrode in any TFT provided per pixel, even if repair for the defect is carried out by separating the pixel electrode of the defective pixel from the short-circuited drain electrode so as to be a dark dot, the repaired pixel tends to visually appear greater in size. Thus, the display quality of the liquid crystal display panel is impaired. Accordingly, the above-described TFT array substrate that includes a plurality of TFTs per pixel is beneficial to a liquid crystal display panel which is a constituent of a large-size liquid crystal television set.

However, as disclosed in PATENT DOCUMENTS 1 and 2, in a case where a normal-operation purpose TFT and a spare-purpose TFT both having a similar structure are provided per pixel, the area proportion of the region being effective for display per pixel is reduced, which results in a reduction in the aperture ratio. Hence, such a structure leaves much to be improved.

The present invention has been made in consideration of the foregoing, and an object thereof is to make it possible to repair any short-circuit established at a source electrode and a drain electrode of a thin film transistor, while suppressing a reduction in the aperture ratio to the minimum possible extent.

Solution to the Problem

In order to achieve the above-described object, according to the present invention, in each thin film transistor, when a short-circuit portion is formed by a short-circuit established at a source electrode and a drain electrode, the source line and the pixel electrode are brought into conduction by a switching element including the short-circuit portion, a second semiconductor portion and a conductive portion.

Specifically, a thin film transistor array substrate of the present invention includes: a plurality of pixel electrodes arranged in a matrix pattern; a plurality of source lines arranged to extend in parallel to one another and each arranged between the pixel electrodes; a plurality of gate lines arranged to extend in parallel to one another and in a direction crossing the source lines; and a plurality of thin film transistors respectively provided per each of intersections of the gate lines and the source lines. The thin film transistors each include: a gate electrode connected to corresponding one of the gate lines; a first semiconductor portion formed to be island-shaped and to overlap the gate electrode having a gate insulating film interposed therebetween; a source electrode arranged to overlap the gate electrode having the gate insulating film and the first semiconductor portion interposed therebetween and connected to corresponding one of the source lines; a drain electrode arranged to overlap the gate electrode having the gate insulating film and the first semiconductor portion interposed therebetween and connected to corresponding one of the pixel electrodes; a second semiconductor portion formed to be island-shaped between the gate insulating film and the source electrode so as to overlap the gate electrode; and a conductive portion arranged to overlap the gate electrode having the gate insulating film and the second semiconductor portion interposed therebetween. The thin film transistors are each configured such that, when a short-circuit portion is formed by a short-circuit established at the source electrode and the drain electrode, the source line connected to the source electrode and the pixel electrode connected to the drain electrode are brought into conduction by a switching element including the short-circuit portion, the second semiconductor portion and the conductive portion.

In the structure described above, each thin film transistor includes a gate electrode, a first semiconductor portion overlapping the gate electrode having a gate insulating film interposed therebetween, a source electrode and a drain electrode overlapping the gate electrode having the gate insulating film and the first semiconductor portion therebetween, a second semiconductor portion overlapping the gate electrode between the gate insulating film and the source electrode, and a conductive portion overlapping the gate electrode having the gate insulating film and the second semiconductor portion interposed therebetween. Therefore, when a short-circuit portion is formed by a short-circuit established at the source electrode and the drain electrode of any thin film transistor, actuation of a switching element that includes the short-circuit portion, the second semiconductor portion and the conductive portion brings the source line and the pixel electrode into conduction, making it possible to repair the short-circuit established at the source electrode and the drain electrode of the thin film transistor. Here, in the switching element that is actuated when a short-circuit is established at the source electrode and the drain electrode, the short-circuit portion functions as a source electrode or a drain electrode of a normal thin film transistor. Therefore, as compared to a case where two similarly structured thin film transistors are provided per pixel, a reduction in the aperture ratio can be suppressed. Accordingly, it becomes possible to repair the short-circuit established at the source electrode and the drain electrode in the thin film transistor, while suppressing a reduction in the aperture ratio to the minimum possible extent.

The conductive portion may be a bypass wiring arranged for each of the source lines per each of the intersections of the gate lines and the source lines, and extends along each of the source lines.

In the structure described above, when a short-circuit portion is formed by a short-circuit established at the source electrode and the drain electrode in any thin film transistor, e.g., by laser radiation, the source line is cut at a prescribed position, so as to separate a duplicately disposed portion of the source line with respect to the bypass wiring. This allows the bypass wiring to function as a new source line and a source electrode, and allows the separated source line and the short-circuited source electrode and the drain electrode to function as a new drain electrode. Hence, a switching element that includes the short-circuit portion, the second semiconductor portion and the conductive portion, that is, a spare thin film transistor is specifically structured.

A channel width and a channel length of the first semiconductor portion defined by the source electrode and the drain electrode may be set to be equal to a channel width and a channel length of the second semiconductor portion defined by the source electrode and the bypass wiring.

In the structure described above, the switching element (spare thin film transistor) including the short-circuit portion, the second semiconductor portion and the conductive portion, and the thin film transistor that operates in a normal mode possess equivalent characteristics. Hence, it becomes possible to repair the short-circuit established at the source electrode and the drain electrode, while suppressing a reduction in display quality.

The gate electrode may be structured with part of the corresponding one of the gate lines, and the corresponding one of the gate lines may be provided with a slit formed around the source electrode and the drain electrode.

In the structure described above, even when the connection state of the short-circuited source electrode and drain electrode is unstable, e.g., by laser radiation, by connecting the source electrode and the part of the gate line to each other and the drain electrode and the part of the gate line to each other, and extending the slit to the side edge of the gate line so as to separate the part of the gate line from the main wiring, the source electrode and the drain electrode are stably connected through the separation portion of the gate line.

The gate electrode may have a protrusion portion in which the corresponding one of the gate lines is protruding sideways, and the source electrode and the drain electrode may be arranged so as to overlap the protrusion portion.

In the structure described above, the gate electrode has a protrusion portion that overlaps the source electrode and the drain electrode. Therefore, when the source electrode and the drain electrode of any thin film transistor are short-circuited and repair is carried out, which involves actuation of the switching element that includes the short-circuit portion, the second semiconductor portion and the conductive portion, e.g., by laser radiation, by cutting a base portion of a protrusion portion so as to separate the protrusion portion from the gate electrode (gate line). This reduces the difference between an amount of overlap of the gate electrode and the drain electrode before the repair and that after the repair, making it possible to repair the short-circuit established at the source electrode and the drain electrode, while suppressing the effect on the gate signal.

The conductive portion may be a floating electrode arranged per each of the intersections of the gate lines and the source lines, and extends along the source electrode, and the gate electrode may be structured with part of the corresponding one of the gate lines, and the corresponding one of the gate lines may be provided with a slit formed so as to cross the drain electrode and the floating electrode.

In the structure described above, when a short-circuit portion is formed by a short-circuit established at the source electrode and the drain electrode in any thin film transistor, e.g., by laser radiation, the drain electrode is cut at a portion overlapping the slit; the slit is extended to the side edge of the gate line and to separate the part of the gate line from the main wiring; and the separation portion of the gate line is connected to each of the pixel electrode side of the cut drain electrode and the floating electrode. This allows the short-circuited source electrode and one piece of the cut drain electrode to function as a new source electrode, and allows the floating electrode, the separation portion of the gate line and the other piece of the cut drain electrode to function as a new drain electrode. Hence, a switching element that includes the short-circuit portion, the second semiconductor portion and the conductive portion, that is, a spare thin film transistor, is specifically structured.

The thin film transistor array substrate having the above-described structure is particularly effective when applied to a display panel structured with the thin film transistor array substrate, a counter substrate disposed to oppose to the thin film transistor array substrate, and a display medium layer arranged between the substrates.

A method for manufacturing a thin film transistor array substrate according to the present invention is a method for manufacturing a thin film transistor array substrate that includes: a plurality of pixel electrodes arranged in a matrix pattern: a plurality of source lines arranged to extend in parallel to one another and each arranged between the pixel electrodes; a plurality of gate lines arranged to extend in parallel to one another and in a direction crossing the source lines; and a plurality of thin film transistors respectively provided per each of intersections of the gate lines and the source lines. The thin film transistors each include: a gate electrode connected to corresponding one of the gate lines; a first semiconductor portion formed to be island-shaped and to overlap the gate electrode having a gate insulating film interposed therebetween; a source electrode arranged to overlap the gate electrode having the gate insulating film and the first semiconductor portion interposed therebetween and connected to corresponding one of the source lines; a drain electrode arranged to overlap the gate electrode having the gate insulating film and the first semiconductor portion interposed therebetween and connected to corresponding one of the pixel electrodes; a second semiconductor portion formed to be island-shaped between the gate insulating film and the source electrode so as to overlap the gate electrode; and a conductive portion arranged to overlap the gate electrode having the gate insulating film and the second semiconductor portion interposed therebetween. The method for manufacturing a thin film transistor array substrate according to the present invention includes: an inspecting step of detecting, out of the plurality of thin film transistors, a thin film transistor in which a short-circuit portion is formed by a short-circuit established at the source electrode and the drain electrode; and a repairing step being carried out for the thin film transistor upon detection of the short-circuit portion in the inspecting step, by bringing the source line connected to the source electrode and the pixel electrode connected to the drain electrode into conduction by a switching element including the short-circuit portion, the second semiconductor portion and the conductive portion.

In the method described above, each thin film transistor includes a gate electrode, a first semiconductor portion overlapping the gate electrode having a gate insulating film interposed therebetween, a source electrode and a drain electrode overlapping the gate electrode having the gate insulating film and the first semiconductor portion therebetween, a second semiconductor portion overlapping the gate electrode between the gate insulating film and the source electrode, and a conductive portion overlapping the gate electrode having the gate insulating film and the second semiconductor portion interposed therebetween. Therefore, when a short-circuit portion is formed by a short-circuit established at the source electrode and the drain electrode of any thin film transistor, and the short-circuit portion is detected in the inspecting step, in the repairing step, actuation of a switching element that includes the short-circuit portion, the second semiconductor portion and the conductive portion brings the source line and the pixel electrode into conduction, making it possible to repair the short-circuit established at the source electrode and the drain electrode of the thin film transistor. Here, in the switching element that is actuated when a short-circuit is established at the source electrode and the drain electrode, the short-circuit portion functions as a source electrode or a drain electrode of a normal thin film transistor. Therefore, as compared to a case where two similarly structured thin film transistors are provided per pixel, a reduction in the aperture ratio can be suppressed. Accordingly, it becomes possible to repair the short-circuit established at the source electrode and the drain electrode thin film transistor, while suppressing a reduction in the aperture ratio to the minimum possible extent.

The conductive portion may be a bypass wiring arranged for each of the source lines per each of the intersections of the gate lines and the source lines, and extends along each of the source lines. In the repairing step, by subjecting the source line connected to the thin film transistor to laser radiation, a duplicately disposed portion of the source line with respect to the bypass wiring may be separated.

In the method described above, the conductive portion is a bypass wiring of each of the source lines, and in the repairing step, a duplicately disposed portion of the source line with respect to the bypass wiring is separated by laser radiation. This allows the bypass wiring to function as a new source line and a source electrode, and allows the separated source line and the short-circuited source electrode and the drain electrode to function as a drain electrode. Hence, in the repairing step, a switching element that includes the short-circuit portion, the second semiconductor portion and the conductive portion, that is, a spare thin film transistor, is specifically structured.

The gate electrode may be structured with part of the corresponding one of the gate lines, and the corresponding one of the gate lines may be provided with a slit formed around the source electrode and the drain electrode. In the repairing step, by subjecting an overlap portion between the source electrode and the gate line and an overlap portion between the drain electrode and the gate line in the thin film transistor to laser radiation, the source electrode and the gate line may be connected each other, and the drain electrode and gate line may be connected to each other, and by subjecting a portion between the slit and a side edge of the gate line to laser radiation, the part of the gate line may be separated.

In the method described above, the gate electrode is structured with part of the corresponding gate lines, and the gate line is provided with a slit formed around the source electrode and the drain electrode. In the repairing step, by laser radiation, the source electrode and the part of the gate line are connected to each other; the drain electrode and part of the gate line are connected to each other; and the slit is extended to the side edge of the gate line so as to separate the part of the gate line from the main wiring. In this manner, the source electrode and the drain electrode are stably connected through the separation portion of the gate line. Hence, even when the connection state of the short-circuited source electrode and drain electrode detected in the inspecting step is unstable, the source electrode and the drain electrode can surely be connected. Note that the process of connecting each of the source electrode and the drain electrode to the part of the gate line, and the process of separating the part of the gate line from the main wiring can be carried out in arbitrary order.

The gate electrode may have a protrusion portion in which the corresponding one of the gate lines is protruding sideways. The source electrode and the drain electrode may be arranged so as to overlap the protrusion portion. In the repairing step, by subjecting a base portion of the protrusion portion in the thin film transistor to laser radiation, the protrusion portion may be separated.

In the method described above, the gate electrode has a protrusion portion, and the source electrode and the drain electrode overlap the protrusion portion. In the repairing step, the base portion of the protrusion portion is cut by laser radiation so as to separate the protrusion portion from the gate electrode (gate line). This reduces the difference between an amount of overlap of the gate electrode and the drain electrode before and that after the repair in, making it possible to repair the short-circuit established at the source electrode and the drain electrode, while suppressing the effect on the gate signal.

The conductive portion may be a floating electrode arranged per each of the intersections of the gate lines and the source lines, and may extend along the source electrode. The gate electrode may be structured with part of the corresponding one of the gate lines, and the corresponding one of the gate lines is provided with a slit formed so as to cross the drain electrode and the floating electrode. In the repairing step, in the thin film transistor, by subjecting the drain electrode to laser radiation via the slit, the drain electrode may be cut; by subjecting a portion between the slit and a side edge of the gate line, the part of the gate line may be separated; and by subjecting an overlap portion between the separated gate line and the floating electrode and an overlap portion between the separated gate line and the drain electrode to laser radiation, the separated gate line and the floating electrode may be connected to each other, and the separated gate line and the cut drain electrode may be connected to each other.

In the method described above, the conductive portion is a floating electrode that extends along the source electrode, and the gate electrode is structured with part of corresponding one of the gate lines, and the corresponding one of the gate lines is provided with a slit formed so as to cross the drain electrode and the floating electrode. In the repairing step, by laser radiation, the drain electrode is cut at a portion overlapping the slit; the slit is extended to the side edge of the gate line; the part of the gate line is separated from the main wiring; and the part of the gate line is connected to each of the cut drain electrode and the floating electrode. This allows the short-circuited source electrode and one piece of the cut drain electrode to function as a new source electrode, and allows the floating electrode, the separation portion of the gate line and the other piece of the cut drain electrode to function as a new drain electrode. Hence, in the repairing step, a switching element that includes the short-circuit portion, the second semiconductor portion and the conductive portion, that is, a spare thin film transistor, is specifically structured. Note that the process of cutting the drain electrode at a portion overlapping the slit, the process of separating the part of the gate line from the main wiring, and the process of connecting the part of the gate line to each of cut drain electrode and the floating electrode can be carried out in arbitrary order.

Advantages of the Invention

With the present invention, when a short-circuit portion is formed by a short-circuit established at the source electrode and the drain electrode in any thin film transistor, the switching element including the short-circuit portion, the second semiconductor portion and the conductive portion brings the source line and the pixel electrode into conduction. Hence, it becomes possible to repair the short-circuit established at the source electrode and the drain electrode of the thin film transistor, while suppressing a reduction in the aperture ratio to the minimum possible.

BRIEF DESCRIPTION OF THE DRAWINGS

FIG. 2 is a plan view of a TFT 5 that structures the TFT array substrate 20a.

DESCRIPTION OF EMBODIMENTS

Figure 1:
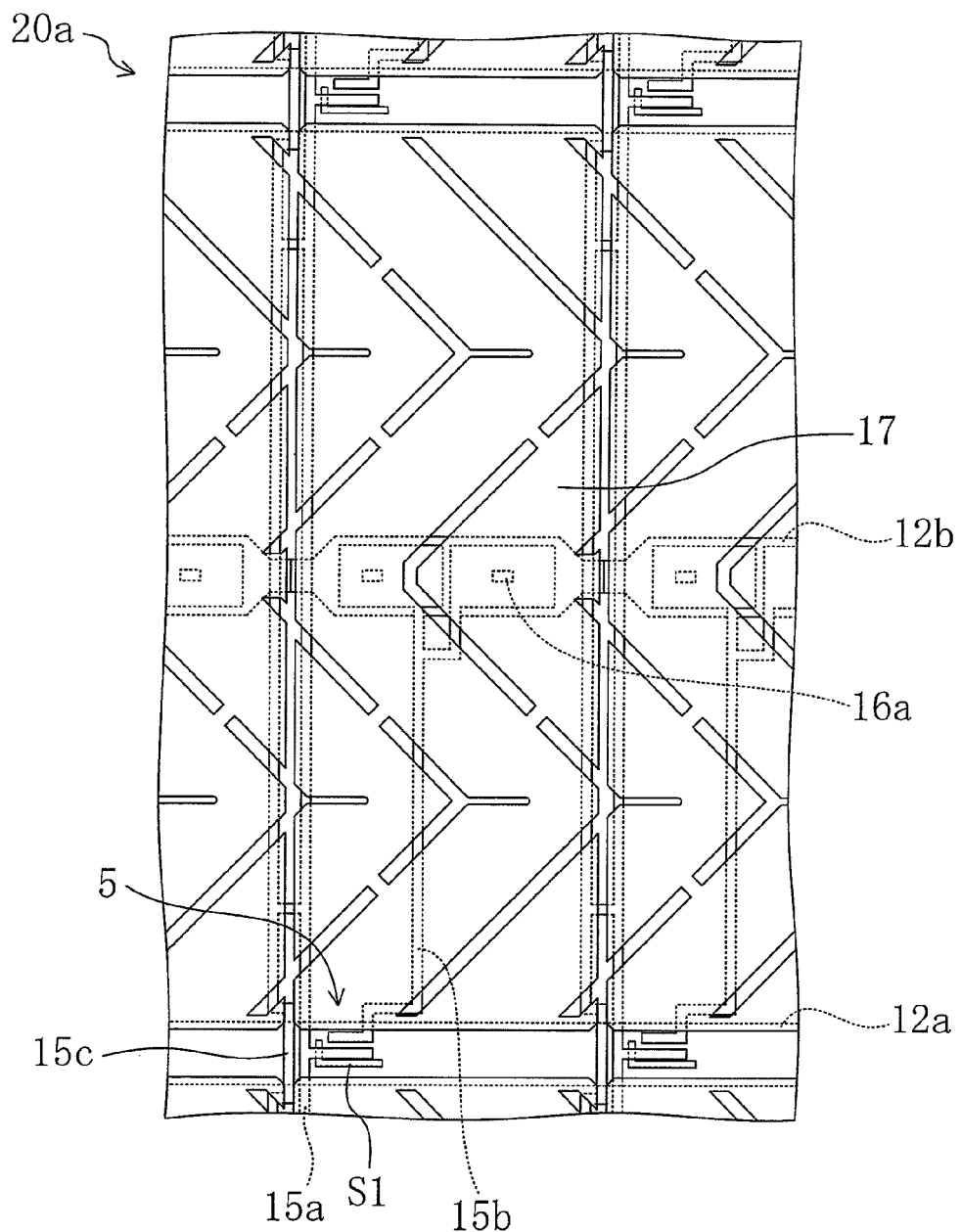
FIG. 1 is a plan view of a TFT array substrate 20a in accordance with a first embodiment.

In the following, embodiments of the present invention will be described in detail, referring to the drawings. Note that the present invention is not limited to the embodiments which will follow.

First Embodiment of the Invention

Figure 2:
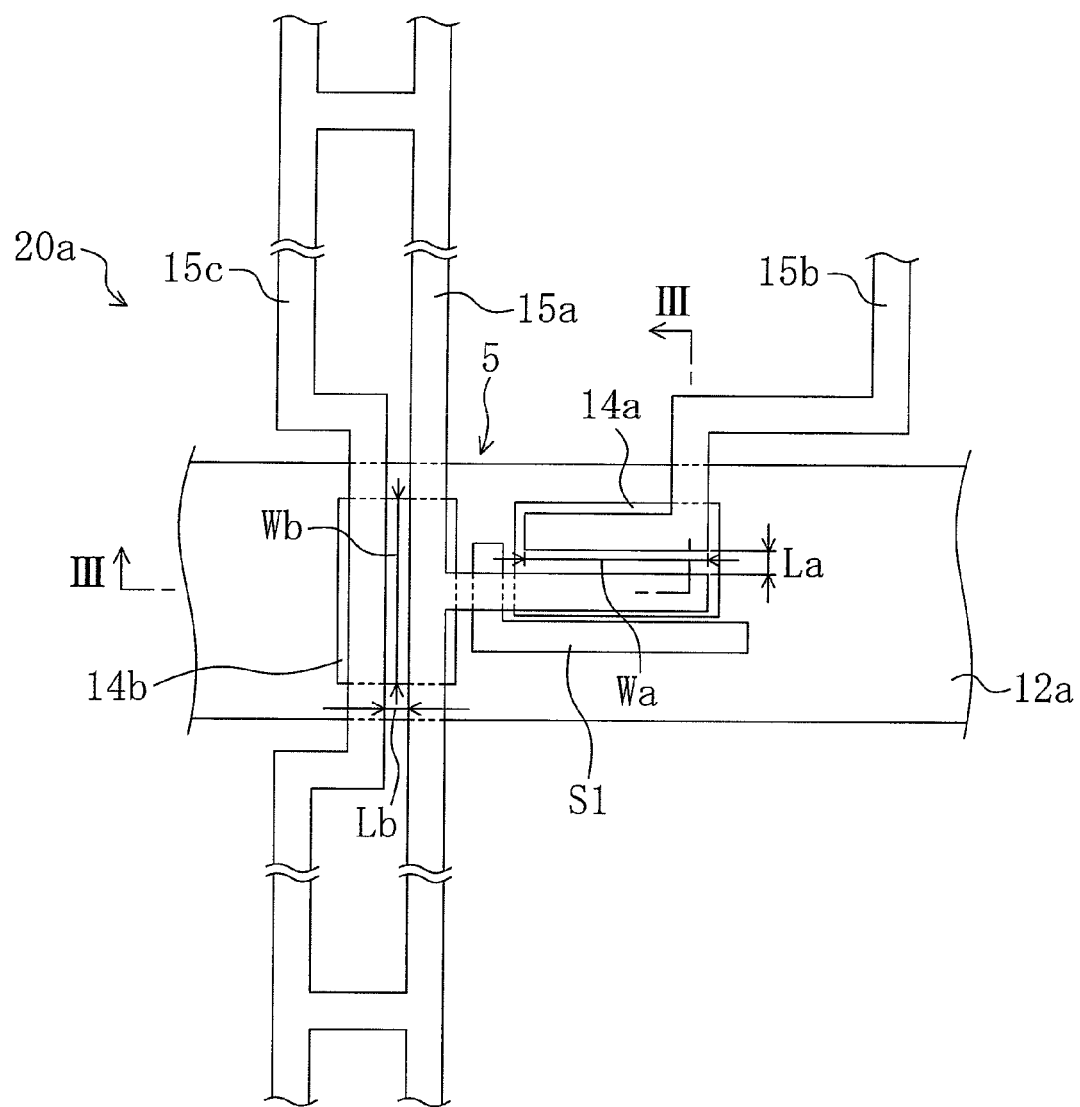
Figure 3:
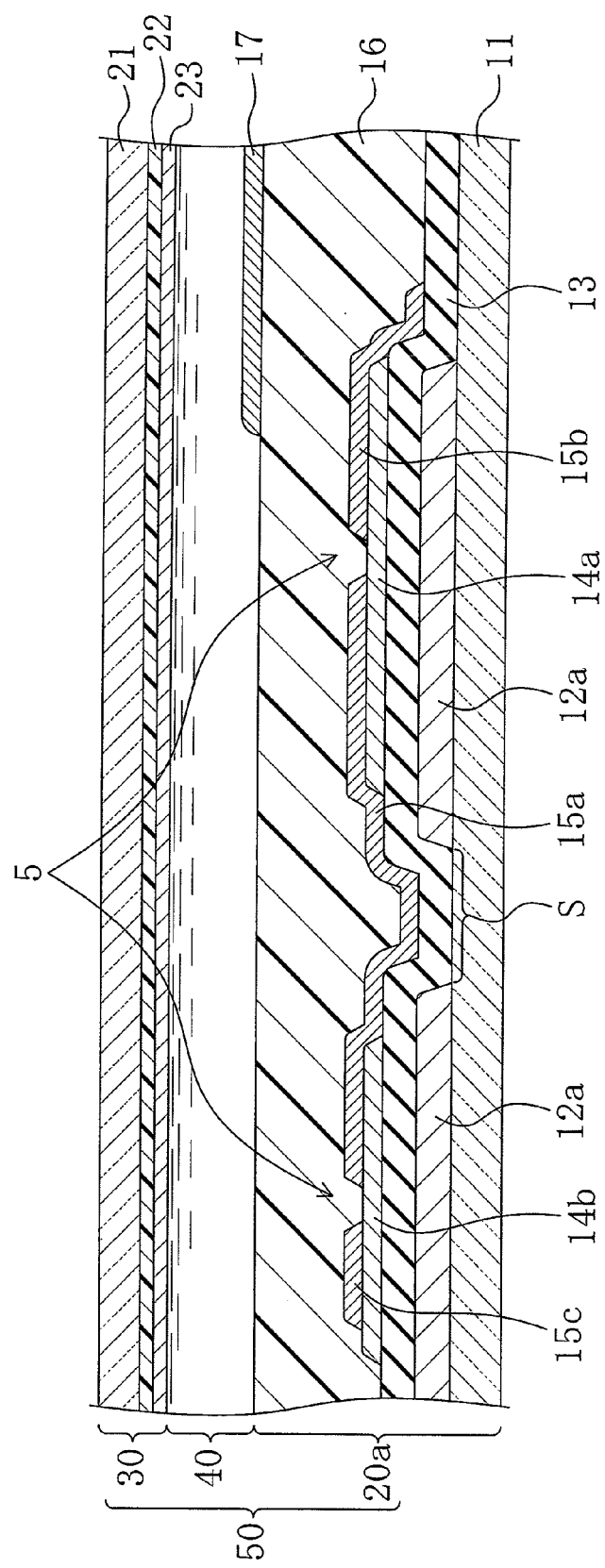
FIG. 3 is a cross-sectional view of a liquid crystal display panel 50 taken along line III-III in FIG. 2.

FIGS. 1 to 4 show a first embodiment of a thin film transistor (TFT) array substrate, a display panel comprising the same, and a method for manufacturing a thin film transistor (TFT) array substrate of the present invention. Specifically, FIG. 1 is a plan view of a TFT array substrate 20a of the present embodiment, and FIG. 2 is an enlarged plan view of a TFT that structures the TFT array substrate 20a. FIG. 3 is a cross-sectional view of a liquid crystal display panel 50 taken along line in FIG. 2.

As shown in FIG. 3, the liquid crystal display panel 50 includes the TFT array substrate 20a and a counter substrate 30 that are disposed to oppose to each other, and a liquid crystal layer 40 that is provided as a display medium layer arranged between the TFT array substrate 20a and the counter substrate 30.

As shown in FIG. 1, the TFT array substrate 20a includes a plurality of pixel electrodes 17 that are arranged in a matrix pattern, a plurality of gate lines 12a that are arranged to extend in parallel to one another and each between the pixel electrodes 17 horizontally in the drawing, a plurality of source line 15a that are arranged in parallel to one another and each between the pixel electrodes 17 vertically in the drawing, a plurality of capacitor lines 12b that are arranged to extend in parallel to one another, each between corresponding ones of the gate lines 12a and crossing corresponding one of the pixel electrodes 17, and a plurality of TFTs 5 that are arranged at intersections of the gate lines 12a and the source lines 15a, respectively.

As shown in FIG. 3, the TFTs 5 each include: a gate electrode (12a) that is part of corresponding one of the gate lines 12a arranged on the insulating substrate 11; a gate insulating film 13 that is arranged so as to cover the gate electrode 12a; a first semiconductor portion 14a that is arranged to be island-shaped so as to overlap the gate electrode 12a having the gate insulating film 13 interposed therebetween; a source electrode (15a) that is arranged so as to overlap the gate electrode 12a having the gate insulating film 13 and the first semiconductor portion 14a interposed therebetween, and that is a sideways protruding portion of corresponding one of the source lines 15a; a drain electrode 15b that is arranged so as to overlap the gate electrode 12a having the gate insulating film 13 and the first semiconductor portion 14a interposed therebetween, and that is connected to corresponding one of the pixel electrodes 17; a second semiconductor portion 14b that is arranged to be island-shaped between the gate insulating film 13 and the source electrode 15a so as to overlap the gate electrode 12a; and a bypass wiring 15c that is provided as a conductive portion and arranged so as to overlap the gate electrode 12a having the gate insulating film 13 and the second semiconductor portion 14b interposed therebetween.

As shown in FIG. 1, the drain electrode 15b is arranged to extend to corresponding one of the capacitor lines 12b, and structures an auxiliary capacitor by overlapping the capacitor line 12b having the gate insulating film 13 interposed therebetween.

As shown in FIG. 3, an interlayer insulating film 16 is provided between the layer of the source electrode (source line) 15a, the drain electrode 15b and the bypass wiring 15c and the layer of the pixel electrode 17. As shown in FIG. 1, the drain electrode 15b is connected to the pixel electrode 17 via a contact hole 16a formed at the interlayer insulating film 16 on corresponding one of the capacitor lines 12b.

As shown in FIGS. 1 and 2, the bypass wiring 15c is arranged to extend along corresponding one of the source lines 15a, and connected to the source line 15a on the opposite sides of corresponding one of the gate lines 12a.

As shown in FIG. 2, in the TFT 5, a channel width Wa and a channel length La of the first semiconductor portion 14a which are defined by the source electrode 15a and the drain electrode 15b are set to be equal to a channel width Wb and a channel length Lb of the second semiconductor portion 14b which are defined by the source electrode 15a and the bypass wiring 15c (e.g., La=Lb=4.0 µm, Wa=Wb=30.0 µm). This allows the TFT including the second semiconductor portion 14b that operates after a defect repair is carried out and the TFT including the first semiconductor portion 14a that operates in a normal mode to possess equivalent characteristics.

In the gate electrode 12a, around the source electrode 15a and the drain electrode 15b, for example as shown in FIG. 2, an L-shaped slit S1 is formed along the left side and the bottom side, with reference to the drawing, of the first semiconductor portion 14a. Here, the width of the slit S1 is about 5 µm to 10 µm (e.g., 7 µm).

As shown in FIG. 1, a plurality of slits are formed at the pixel electrode 17 so as to extend diagonally and horizontally with reference to the drawing, for the purpose of controlling the alignment of the liquid crystal layer 40.

As shown in FIG. 3, the counter substrate 30 includes a color filter layer 22 that is arranged at the insulating substrate 21, and a common electrode 23 that is arranged so as to cover the color filter layer 22. Here, the color filter layer 22 includes: a black matrix (not shown) that is arranged to be frame-shape and to structure a lattice inside the frame; and, in each division of the lattice of the black matrix so as to be associated with each of the pixel electrodes 17, a colored layer (not shown) that includes a red-colored layer, a green-colored layer and a blue-colored layer.

The liquid crystal layer 40 is nematic liquid crystal which has the electro-optical characteristic, and it includes liquid crystal molecules whose dielectric anisotropy is negative ($\Delta\varepsilon<0$).

The liquid crystal display panel 50 structured as described above is configured as follows. In each pixel being the smallest unit of an image, when the TFT 5 is turned on by a gate signal from the gate line 12a, a source signal from the source line 15a is written via the TFT 5 into the pixel electrode 17. This results in a potential difference between such the electrodes 17 of the TFT array substrate 20a and the common electrode 23 of the counter substrate 30, whereby a prescribed voltage is applied to the liquid crystal layer 40. With the liquid crystal display panel 50, utilizing the nature of the liquid crystal layer 40 which changes its alignment state in accordance with the magnitude of the voltage applied thereto, the transmittance of light coming from the backlight is adjusted, so as to display an image.

Next, a method for manufacturing the liquid crystal display panel 50 will be described. The manufacturing method in accordance with the present embodiment includes a TFT array substrate fabricating step, a counter substrate fabricating step, a seal material applying step, a liquid crystal dropping step, a bonding step, an inspecting step, and a repairing step.

<TFT Array Substrate Fabricating Step>

First, over an insulating substrate 11 such as a glass substrate, a titanium film, an aluminum film, a titanium film and the like are successively deposited by the sputtering method. Thereafter, this metal layered film is patterned by photolithography (i.e., subjected to dry etching using chlorine-based gas or the like as the etching gas) to form gate lines (gate electrode) 12a and capacitor lines 12b.

Subsequently, over the entire substrate on which the gate lines (gate electrode) 12a and the capacitor lines 12b are formed, by the plasma CVD method, a gate insulating film 13 (with a thickness of about 4000 Å) made up of a silicon nitride film and the like, an active semiconductor film made up of an amorphous silicon film and the like, and a low resistance semiconductor film made up of an n+ amorphous silicon film doped with, e.g., phosphorus, and the like are successively deposited. Thereafter, by the sputtering method, an aluminum film, a titanium film and the like are deposited. Thereafter, patterning is carried out by photolithography (i.e., dry etching is carried out using chlorine-based gas or the like as the etching gas), whereby source lines (source electrodes) 15a, drain electrodes 15b and bypass wirings 15c are formed. Further, the portions between the source lines (source electrodes) 15a and the drain electrodes 15b, and between the source lines (source electrodes) 15a and the bypass wirings 15c of the low resistance semiconductor film, are subjected to dry etching using chlorine-based gas or the like as the etching gas, and first semiconductor portions 14a and second semiconductor portions 14b are patterned to form TFTs 5.

Thereafter, over the entire substrate on which the TFTs 5 are formed, by the spin coating method, an acrylic-based photosensitive resin or the like is applied. By exposing the applied photosensitive resin via a photomask and thereafter developing the same, an interlayer insulating film 16 (with a thickness of about 3 µm) is formed, in which contact holes 16a are respectively formed in regions overlapping the drain electrodes 15b.

Further, over the entire substrate on which the interlayer insulating film 16 is formed, a transparent conductive film such as an ITO (Indium Tin Oxide) film is deposited by the sputtering method. Thereafter, patterning is carried out by photolithography (i.e., wet etching is carried out using aqueous ferric chloride) to form pixel electrodes 17. Note that, when forming the pixel electrodes 17, slits for structuring MVA (Multi-domain Vertical Alignment) are patterned at the same time.

Finally, over the entire substrate at which the pixel electrodes 17 are formed, a polyimide-based resin is applied by the printing method. Thus, an alignment film (not shown) is formed.

In the manner described above, the TFT array substrate 20a can be fabricated.

<Counter Substrate Fabricating Step>

First, on an insulating substrate 21 such as a glass substrate, a negative-type acrylic-based photosensitive resin in which carbon particles are dispersed is applied by the spin coating method. By exposing the applied photosensitive resin via a photomask and thereafter developing the same, a black matrix is formed.

Subsequently, on the substrate in which the black matrix is formed, a negative-type acrylic-based photosensitive resin, e.g., being colored red, green or blue, is applied. By exposing the applied photosensitive resin via a photomask and thereafter developing to thereby carry out patterning of the same, a colored layer of the selected color (e.g., a red-colored layer) is formed. Such steps are repeatedly performed for the other two colors, to form colored layer of the other two colors (i.e., a green-colored layer and a blue-colored layer). Thus, the color filter layer 22 is formed.

Further, on the substrate at which the color filter layer 22 is formed, an ITO film, for example, is deposited by the sputtering method. Thus, the common electrode 23 is formed.

Thereafter, over the entire substrate at which the common electrode 23 is formed, a positive-type phenolic novolac-based photosensitive resin is applied by the spin coating method. By exposing the applied photosensitive resin via a photomask and thereafter developing the same, projections for vertical alignment control (not shown) can be formed.

Finally, over the entire substrate at which the projections are formed, a polyimide-based resin is applied by the printing method. Thus, an alignment film (not shown) is formed.

In the manner described above, the counter substrate 30 can be fabricated.

<Seal Material Applying Step>

Using a dispenser, for example, a seal material which is made up of, for example, a resin that is cured by a combination of ultraviolet and heat, is applied in a frame-like shape to the counter substrate 30 which has been fabricated in the counter substrate fabricating step.

<Liquid Crystal Dropping Step>

A liquid crystal material is dropped into a region surrounded by the seal material that has been applied to the counter substrate 30 in the seal material applying step.

<Bonding Step>

First, the counter substrate 30 into which the liquid crystal material that has been dropped in the liquid crystal dropping step and the TFT array substrate 20a that has been fabricated in the TFT array substrate fabricating step are bonded to each other under reduced pressure. Thereafter, by placing the resulting bonded structure under atmospheric pressure, the surface of the bonded structure is pressurized.

Subsequently, the seal material being interposed within the bonded structure is irradiated with UV light. Thereafter, the bonded structure is heated. Thus, the seal material is cured.

Figure 4:
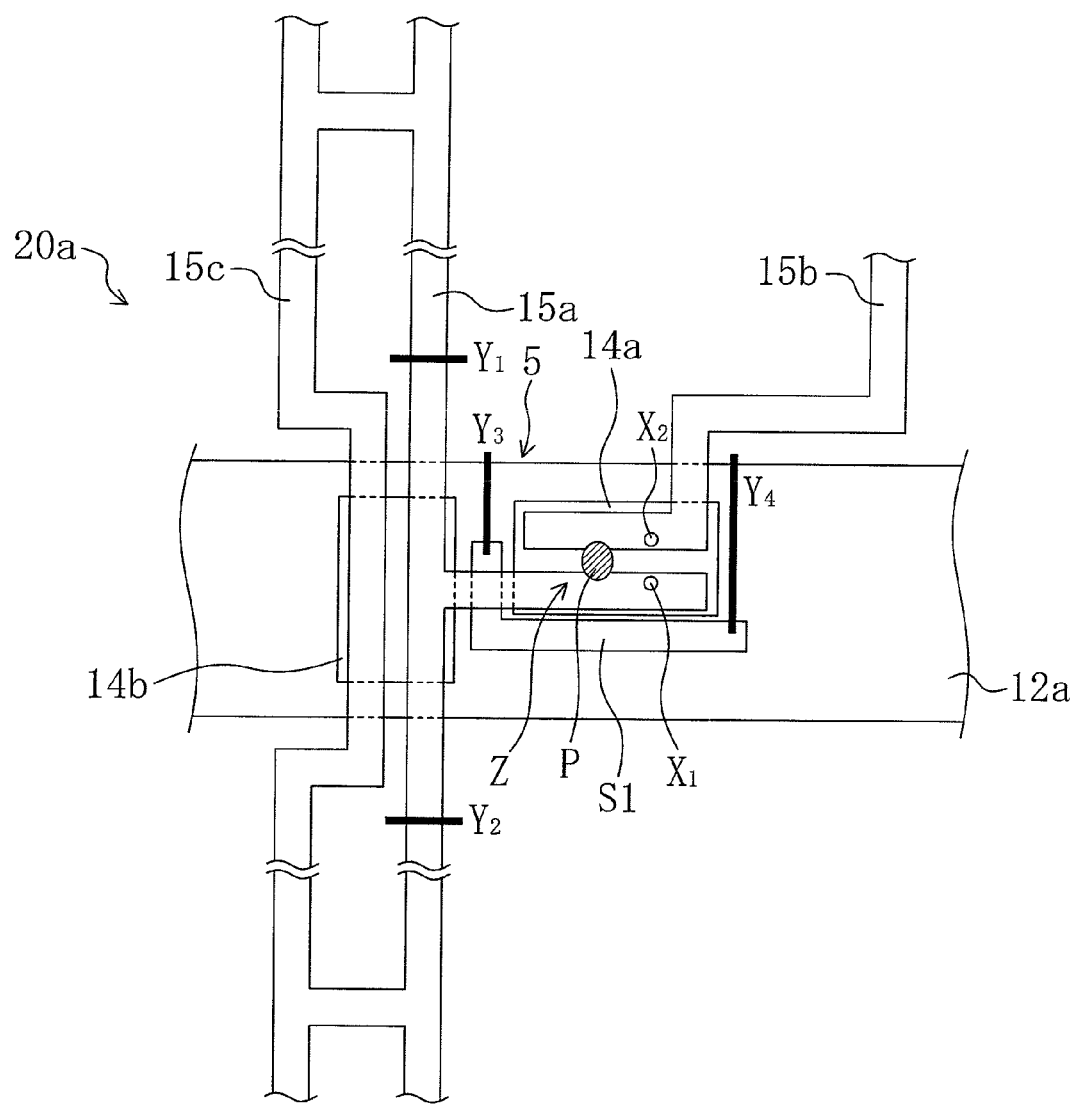
FIG. 4 is a plan view of the TFT array substrate 20a after a defect repair is carried out.

In the manner described above, the liquid crystal display panel 50 (before inspection) can be manufactured. Thereafter, the inspecting step which will be described below is carried out for each of the manufactured liquid crystal display panels 50. When any pixel having the TFT 5 whose source electrode 15a and drain electrode 15b are short-circuited is detected, the repairing step which will be described below is carried out, so as to repair the defect. Here, FIG. 4 is a plan view of the TFT array substrate 20a after the defect repair is carried out.

<Inspecting Step>

With the liquid crystal display panel 50 manufactured as described above, a gate inspection signal having a bias voltage of −10V, a period of 16.7 msec, and a pulse voltage of +15V with a pulse width of 50 μsec is provided to each of the gate lines 12a so as to turn on all the TFTs 5. Also, a source inspection signal having a potential of ±2V and having its polarity inverted every 16.7 msec is provided to each of the source lines 15a, such that the source inspection signal is provided to the pixel electrodes 17 via the TFTs 5. At the same time, a common electrode inspection signal having a direct-current potential of −1V is provided to the common electrode 23, whereby a voltage is applied to the liquid crystal layer 40 between the pixel electrodes 17 and the common electrode 23, causing the pixels structured by the pixel electrodes 17 to light up. Here, with a liquid crystal display panel 50, for example, of a normally black mode (i.e., of a mode in which black display is presented when no voltage is applied), the display screen changes from black display to white display. Here, at a pixel in which a short-circuit portion Z is formed (defective pixel) by a short-circuit established at the source electrode 15a and the drain electrode 15b because of any film residue P (see FIG. 4) or the like, the source inspection signal is constantly entered to the corresponding pixel electrode 17 irrespective of ON/OFF control of the TFT 5. Accordingly, such a defective pixel is detected as a bright dot in a display screen presenting black display.

<Repairing Step>

As shown in FIG. 4, an overlap portion X1 between the gate line 12a and the source electrode 15a and an overlap portion X2 between the gate line 12a and the drain electrode 15b in the TFT 5 of the defective pixel are subjected to laser radiation (e.g., by a YAG laser) from the insulating substrate 11 side, such that a contact hole is formed at the gate insulating film 13 of each of the overlap portions X1 and X2, whereby the gate line 12a and the source electrode 15a are connected to each other, and the gate line 12a and the drain electrode 15b are connected to each other. Further, as shown in FIG. 4, the gate line 12a in the TFT 5 of the defective pixel is subjected to laser radiation (e.g., by a YAG laser) at positions Y3 and Y4 from the insulating substrate 11 side, so as to separate, in conjunction with the slit S1, part of the gate line 12a. In this way, the source electrode 15a and the drain electrode 15b are surely connected through the separation portion of the gate line 12a.

Further, as shown in FIG. 4, the source line 15a in the TFT 5 of the defective pixel is subjected to laser radiation (e.g., by a YAG laser) at positions Y1 and Y2 from the insulating substrate 11 side, so as to separate a duplicately disposed portion of the source line 15a with respect to the bypass wiring 15c. This allows the bypass wiring 15c to function as a source line and a source electrode after the defect repair is carried out, and to allow the separated source line 15a as well as the surely connected source electrode 15a and the drain electrode 15b to function as a drain electrode after the defect repair is carried out.

As described in the foregoing, with the TFT array substrate 20a, the liquid crystal display panel 50 comprising the same, and the manufacturing method thereof in accordance with the present embodiment, each TFT 5 includes the gate electrode 12a, the first semiconductor portion 14a that overlaps the gate electrode 12a having the gate insulating film 13 interposed therebetween, the source electrode 15a and the drain electrode 15b that overlap the gate electrode 12a having the gate insulating film 13 and the first semiconductor portion 14a interposed therebetween, and the second semiconductor portion 14b that overlap the gate electrode 12a between the gate insulating film 13 and the source electrode 15a, and the bypass wiring 15c that overlap the gate electrode 12a having the gate insulating film 13 and the second semiconductor portion 14b interposed therebetween. Accordingly, if the source electrode 15a and the drain electrode 15b of each TFT 5 are short-circuited by a film residue P, resulting in formation of a short-circuit portion Z, which is detected in the inspecting step, then in the repairing step, the duplicately disposed portion of the source line 15a with respect to the bypass wiring 15c is separated by laser irradiation. This allows the bypass wiring 15c to function as new source line and source electrode after the defect repair is carried out, and to allow the separated source line 15a and the short-circuited source electrode 15a and the drain electrode 15b to function as new drain electrode after the defect repair is carried out. In this manner, the source line 15a connected to the short-circuited source electrode (15a) and the pixel electrode 17 connected to the short-circuited drain electrode 15b are brought into conduction by the operation of the TFT that includes the short-circuit portion Z of the source electrode 15a and the drain electrode 15b, the second semiconductor portion 14b and the bypass wiring 15c. Hence, short-circuit established at the source electrode 15a and the drain electrode 15b of the TFT 5 can be repaired. Here, in the TFT to be operated when the source electrode 15a and the drain electrode 15b are short-circuited, the short-circuit portion Z functions as a drain electrode of a normal TFT. Therefore, as compared to a case where two similarly structured TFTs are provided per pixel, a reduction in the aperture ratio can be suppressed. Accordingly, it becomes possible to repair the short-circuit established at the source electrode 15a and the drain electrode 15b of any TFT 5, while suppressing a reduction in the aperture ratio to the minimum possible extent.

Further, in accordance with the present embodiment, the gate electrode 12a is structured with part of each gate line 12a, and in each gate line 12a, the slit S1 is formed around the source electrode 15a and the drain electrode 15b. In the repairing step, the source electrode 15a and the drain electrode 15b are each connected to part of the gate line 12a by laser radiation. Further, the slit S1 is extended to the side edge of the gate line 12a to separate part of the gate line 12a from the main wiring. In this manner, the source electrode 15a and the drain electrode 15b are stably connected through the separation portion of the gate line 12a. Therefore, despite the unstable connection state of the source electrode 15a and the drain electrode 15b which are short-circuited because of a film residue P that is detected in the inspecting step, the source electrode 15a and the drain electrode 15b can surely be connected. Note that the process of connecting each of the source electrode 15a and the drain electrode 15b to part of the gate line 12a, and the process of separating the part of the gate line 12a from the main wiring can be carried out in arbitrary order.

Still further, in accordance with the present embodiment, the channel width Wa and the channel length La of the first semiconductor portion 14a, which are defined by the source electrode 15a and the drain electrode 15b, are set to be equal to the channel width and the channel length of the second semiconductor portion 14b, which are defined by the source electrode 15a and the bypass wiring 15c. This allows the TFT that includes the second semiconductor portion 14b that operates after the defect repair is carried out and the TFT that includes the first semiconductor portion 14a that operates in a normal mode to possess equivalent characteristics. Accordingly, it becomes possible to repair the short-circuit established at the source electrode 15a and the drain electrode 15, while suppressing a reduction in display quality.

While the L-shaped slit S1 has been exemplarily described in the present embodiment, the slit may be in any shape such as linear, in so far as it is capable of separating part of the gate line 12a from the main wiring.

Second Embodiment of the Invention

Figure 5:
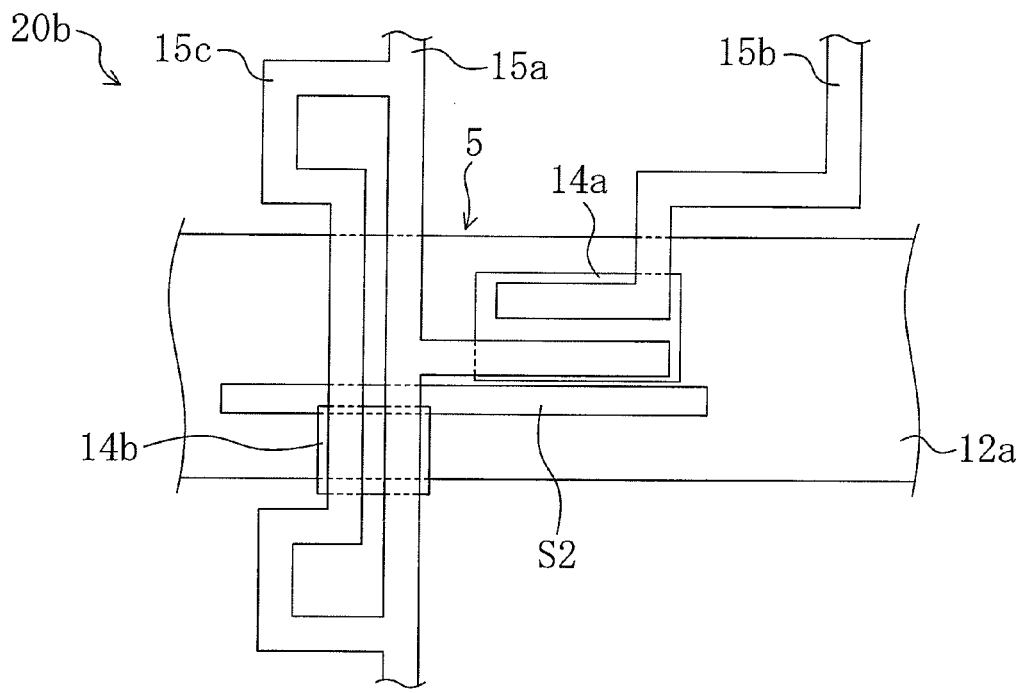
FIG. 5 is a plan view of a TFT array substrate 20b in accordance with a second embodiment.
Figure 6:
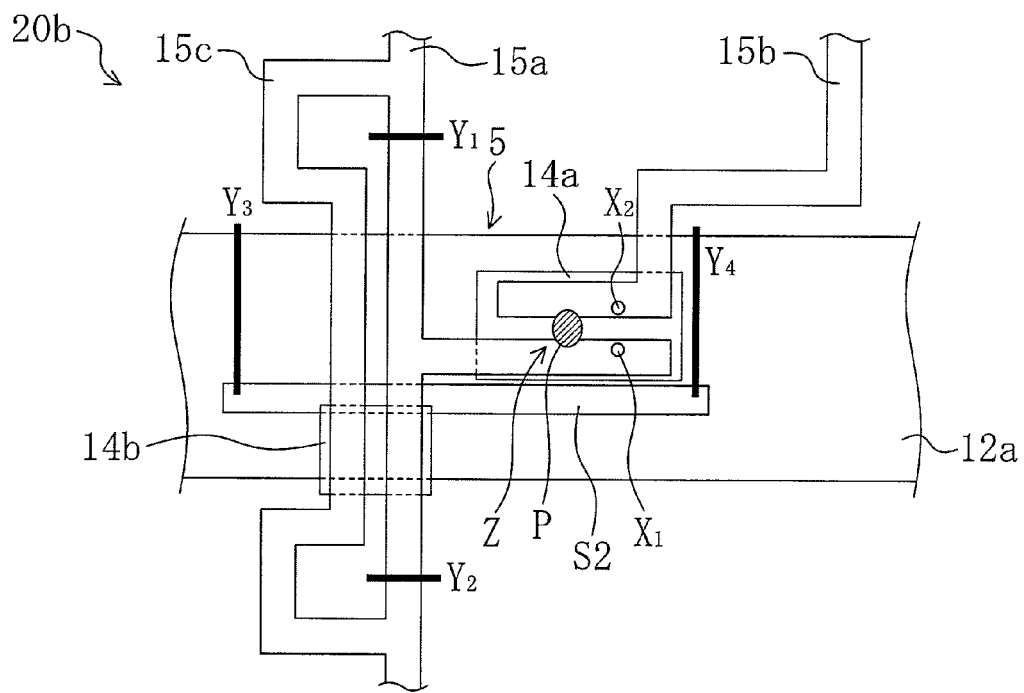
FIG. 6 is a plan view of the TFT array substrate 20b after a defect repair is carried out.

FIG. 5 is a plan view of a TFT array substrate 20b of the present embodiment, and FIG. 6 is a plan view of the TFT array substrate 20b after a defect repair is carried out. Note that, in each of the embodiments that follow, the portions appearing similarly as in FIGS. 1 to 4 are denoted by the same reference characters, and detailed description thereof will be omitted.

As shown in FIG. 2, the TFT array substrate 20a of the first embodiment described above has the slit S1 of the gate line 12a formed in an L-shape along the left side and the bottom side, with reference to the drawing, of the first semiconductor portion 14a. On the other hand, as shown in FIG. 5, the TFT array substrate 20b of the present embodiment has a slit S2 of the gate line 12a formed linearly along the bottom side, with reference to the drawing, of the first semiconductor portion 14a. Therefore, deterioration of the gate signal in the gate line 12a can be suppressed. Further, in the repairing step, as shown in FIG. 6, similarly to the above-described first embodiment, the overlap portion X1 between the gate line 12a and the source electrode 15a and the overlap portion X2 between the gate line 12a and the drain electrode 15b, the positions Y1 and Y2 of the source line 15a, and the positions Y3 and Y4 of the gate line 12a, each being situated in the TFT 5 of the defective pixel, should be subjected to laser radiation.

Third Embodiment of the Invention

Figure 7:
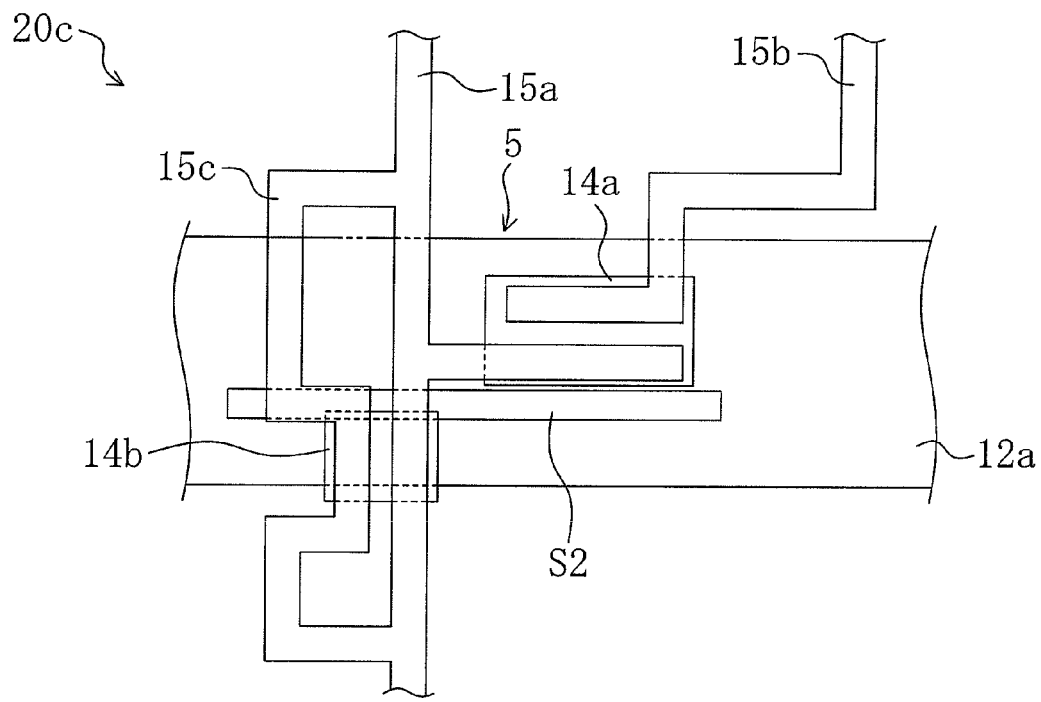
FIG. 7 is a plan view of a TFT array substrate 20c in accordance with a third embodiment.
Figure 8:
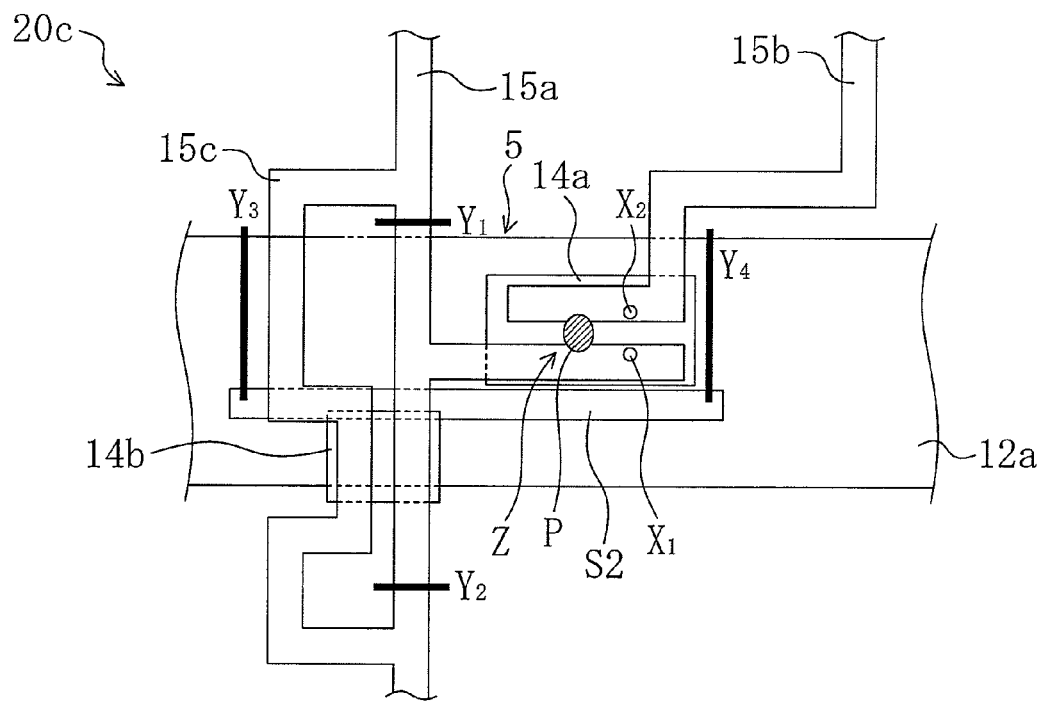
FIG. 8 is a plan view of the TFT array substrate 20c after a defect repair is carried out.

FIG. 7 is a plan view of a TFT array substrate 20c of the present embodiment, and FIG. 8 is a plan view of the TFT array substrate 20c after a defect repair is carried out.

In the TFT array substrates 20a and 20b of the first and second embodiments described above, as shown in FIGS. 2 and 5, respectively, the source line 15a and the bypass wiring 15c are close to each other on the gate line 12a. On the other hand, in the TFT array substrate 20c of the present embodiment, as shown in FIG. 7, the source line 15a and the bypass wiring 15c are partially distanced from each other. Therefore, a short-circuit at the source line 15a and the bypass wiring 15c can be suppressed. Further, in the repairing step, as shown in FIG. 8, similarly to the above-described first and second embodiments, the overlap portion X1 between the gate line 12a and the source electrode 15a and the overlap portion X2 between the gate line 12a and the drain electrode 15b, the positions Y1 and Y2 of the source line 15a, and the positions Y3 and Y4 of the gate line 12a, each being situated in the TFT 5 of the defective pixel, should be subjected to laser radiation.

Fourth Embodiment of the Invention

Figure 9:
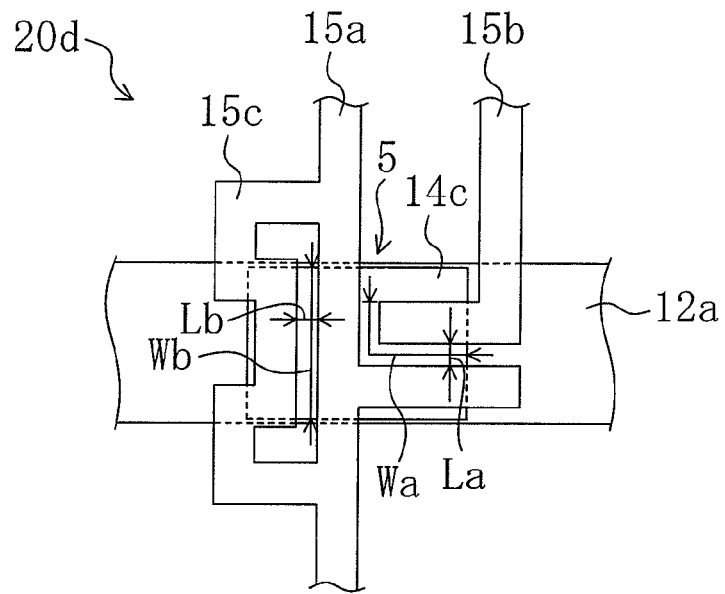
FIG. 9 is a plan view of a TFT array substrate 20d in accordance with a fourth embodiment.
Figure 10:
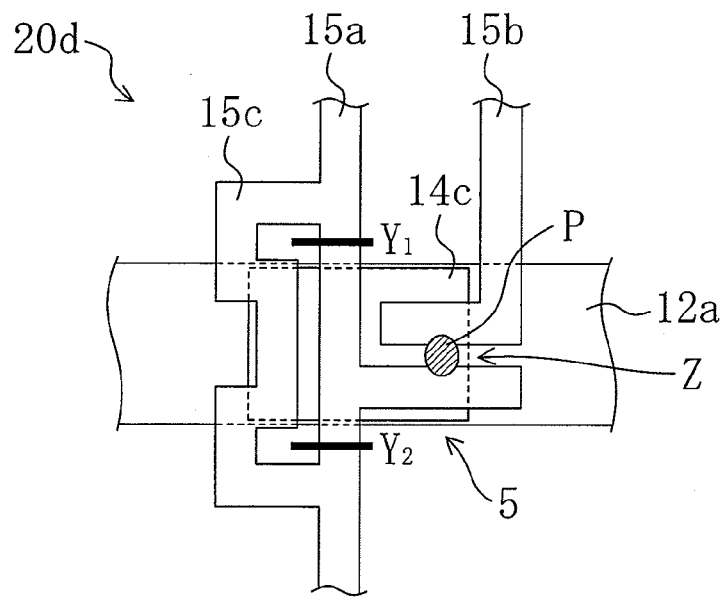
FIG. 10 is a plan view of the TFT array substrate 20d after a defect repair is carried out.

FIG. 9 is a plan view of a TFT array substrate 20d of the present embodiment, and FIG. 10 is a plan view of the TFT array substrate 20d after a defect repair is carried out.

In the TFT array substrates 20a to 20c of the first to third embodiments described above, as shown in FIGS. 2, 5 and 7, respectively, the slit S1 or S2 is formed in the gate line 12a. On the other hand, in the TFT array substrate 20d of the present embodiment, as shown in FIG. 9, no slit is formed in the gate line 12a.

Therefore, in the repairing step, as shown in FIG. 10, only the positions Y1 and Y2 of the source line 15a in the TFT 5 of the defective pixel are subjected to laser radiation.

Further, in the TFT array substrates 20a to 20c of the first to third embodiments described above, the first semiconductor portion 14a and the second semiconductor portion 14b are formed as separate films. On the other hand, in the TFT array substrate 20d of the present embodiment, a semiconductor portion 14c being an integrated film of the first semiconductor portion and the second semiconductor portion is arranged. Note that, in the semiconductor portion 14c, a region overlapping the protrusion portion of the source line 15a and the drain electrode 15b is defined as the first semiconductor portion, and a region overlapping the linear portion of the source line 15a and the bypass wiring 15c is defined as the second semiconductor portion.

Still further, in the TFT array substrate 20d of the present embodiment also, the channel width Wa and the channel length La of the first semiconductor portion, which are defined by the source electrode 15a and the drain electrode 15b, are set to be equal to the channel width Wb and the channel length Lb of the second semiconductor portion, which are defined by the source electrode 15a and the bypass wiring 15c. The channel width Wa is as long as an L-shaped line that is disposed just halfway between the source electrode 15a and the drain electrode 15b, as shown in FIG. 9.

Fifth Embodiment of the Invention

Figure 11:
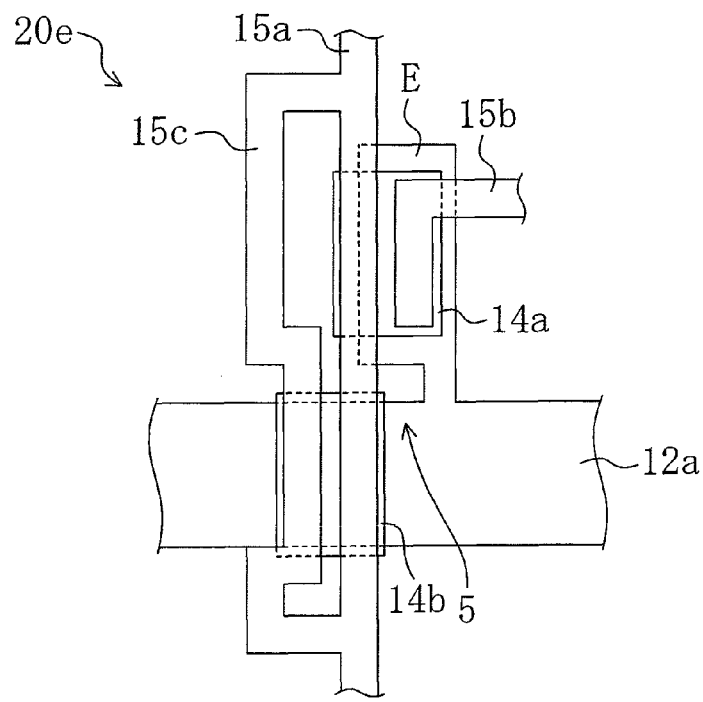
FIG. 11 is a plan view of a TFT array substrate 20e in accordance with a fifth embodiment.
Figure 12:
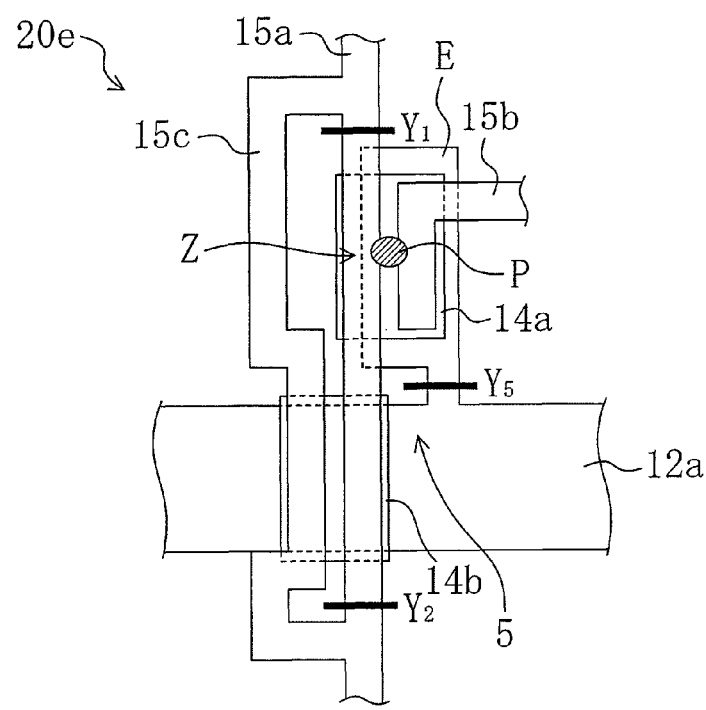
FIG. 12 is a plan view of the TFT array substrate 20e after a defect repair is carried out.

FIG. 11 is a plan view of a TFT array substrate 20e of the present embodiment, and FIG. 12 is a plan view of the TFT array substrate 20e after a defect repair is carried out.

In the TFT array substrates 20a to 20d of the first to fourth embodiments described above, as shown in FIGS. 2, 5, 7, and 9, respectively, the gate electrode 12a is structured with part of the gate line (12a). On the other hand, in the TFT array substrate 20e of the present embodiment, as shown in FIG. 11, the gate electrode of the TFT for use in a normal operation mode is structured with a protrusion portion E of the gate line 12a.

Therefore, in the repairing step, while the positions Y1 and Y2 of the source line 15a in the TFT 5 of the defective pixel are subjected to the laser radiation, a base portion (position Y5) of the protrusion portion E is also subjected to laser radiation, so as to separate the protrusion portion E from the gate line 12a. This reduces the difference between an amount of overlap of the protrusion portion E that functions as a gate electrode before a defect repair is carried out and the drain electrode 15b, and an amount of overlap of the gate electrode 12a after the defect repair is carried out and the separated source line 15a that functions as a drain electrode. Therefore, it becomes possible to repair a short-circuit established at the source electrode 15a and the drain electrode 15b while suppressing the effect on the gate signal.

Sixth Embodiment of the Invention

Figure 13:
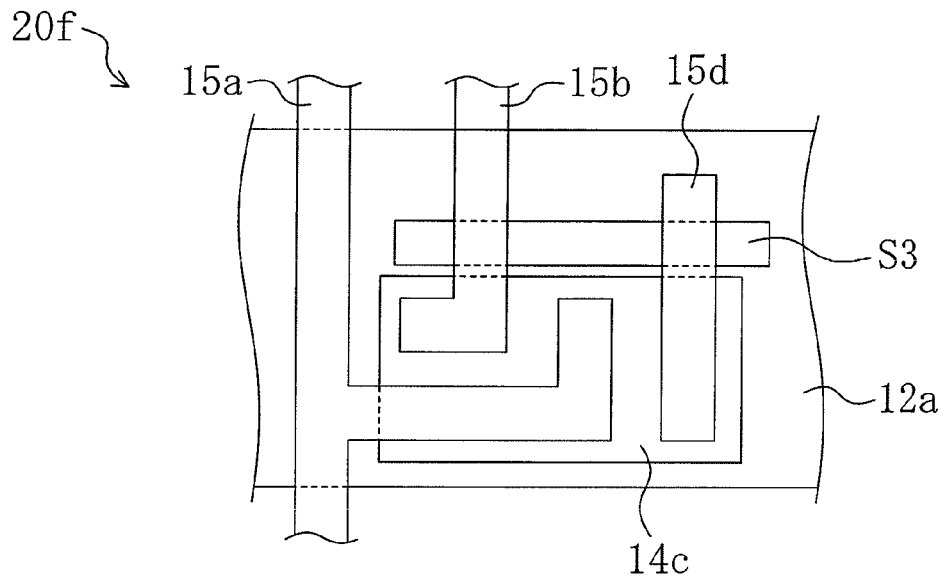
FIG. 13 is a plan view of a TFT array substrate 20f in accordance with a sixth embodiment.
Figure 14:
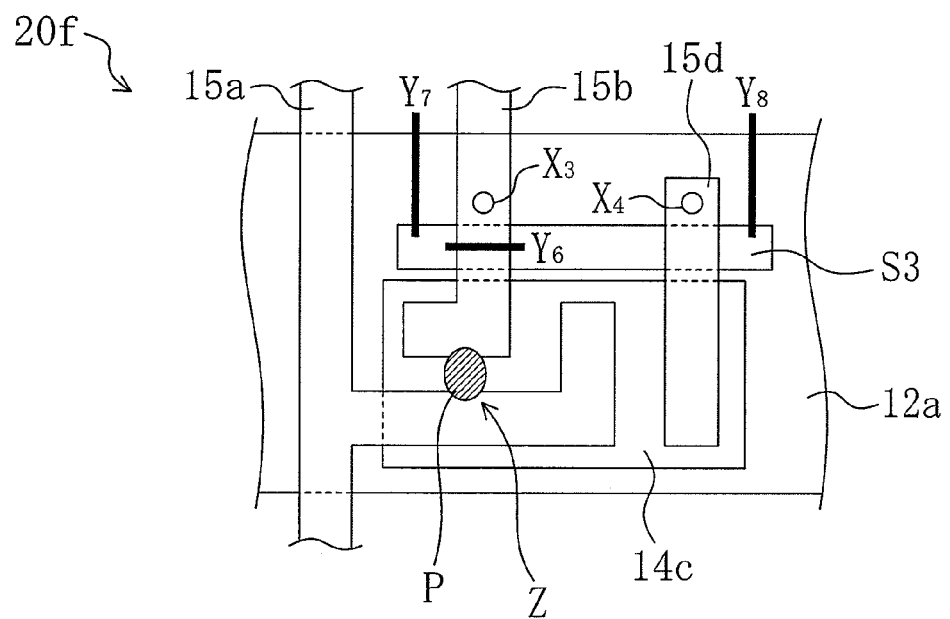
FIG. 14 is a plan view of the TFT array substrate 20f after a defect repair is carried out.

FIG. 13 is a plan view of a TFT array substrate 20f of the present embodiment, and FIG. 14 is a plan view of the TFT array substrate 20f after a defect repair is carried out.

In the TFT array substrates 20a to 20e of the first to fifth embodiments described above, as shown in FIGS. 2, 5, 7, 9, and 11, respectively, the bypass wiring 15c is formed as a conductive portion. On the other hand, in the TFT array substrate 20f of the present embodiment, as shown in FIG. 13, a floating electrode 15d is formed as a conductive portion.

Specifically, in the TFT array substrate 20f, as shown in FIG. 13, the floating electrode 15d is formed so as to extend on each gate line 12a and along the tip portion (source electrode) of the protrusion portion of the source line 15a, and a slit S3 is formed at the gate line 12a so as to cross the drain electrode 15b and the floating electrode 15d.

Further, in the repairing step, as shown in FIG. 14, the drain electrode 15b in the TFT 5 of the defective pixel is subjected to laser radiation via the slit S3 (position Y6), so as to cut the drain electrode 15b. Portions between the slit S3 and the side edge of the gate line 12a (positions Y7 and Y8) are subjected to laser radiation, so as to separate, in conjunction with the slit S3, part of the gate line 12a from the main wiring. An overlap portion X3 between the part of the gate line 12a and the drain electrode 15b, and an overlap portion X4 between the part of the gate line 12a and the floating electrode 15d are subjected to laser radiation, so as to connect between the separation portion of the gate line 12a and the floating electrode 15d, and between the separation portion of the gate line 12a and the pixel electrode 17 side of the separated drain electrode 15b. This allows the short-circuited source electrode 15a and one piece of the cut drain electrode 15b to function as a new source electrode after the defect repair is carried out, and the floating electrode 15d, the separation portion of the gate line 12a and the other piece of the cut drain electrode 15b to function as a new drain electrode after the defect repair is carried out. Note that the process of cutting the drain electrode 15b at the portion overlapping the slit S3, the process of separating part of the gate line 12a from the main wiring, and the process of connecting between the part of the gate line 12a and the cut drain electrode 15b and between the part of the gate line 12a and the floating electrode 15d can be carried out in arbitrary order.

Seventh Embodiment of the Invention

Figure 15:
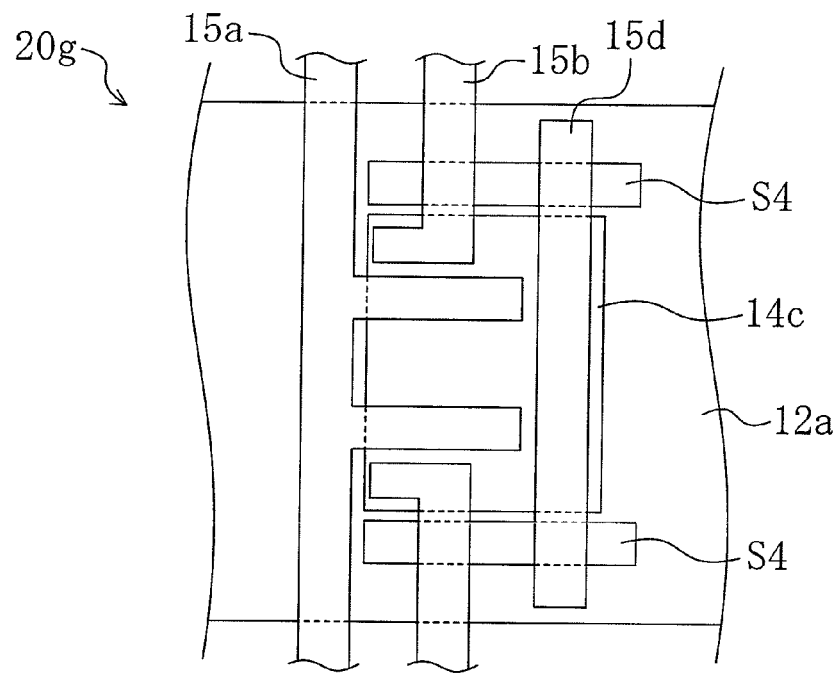
FIG. 15 is a plan view of a TFT array substrate 20g in accordance with a seventh embodiment.
Figure 16:
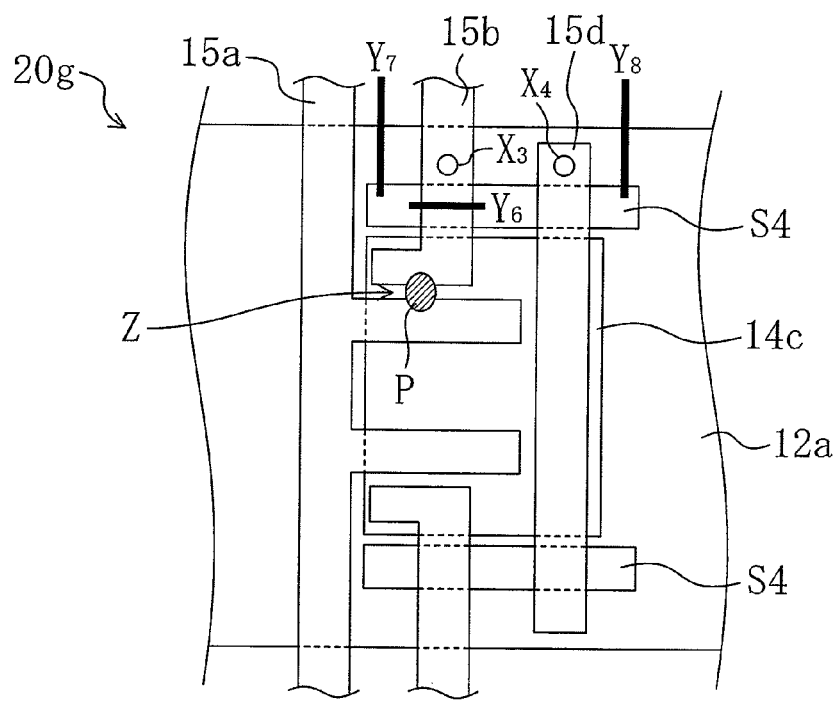
FIG. 16 is a plan view of the TFT array substrate 20g after a defect repair is carried out.

FIG. 15 is a plan view of a TFT array substrate 20g of the present embodiment, and FIG. 16 is a plan view of the TFT array substrate 20g after a defect repair is carried out.

In the TFT array substrate 20f of the sixth embodiment described above, as shown in FIG. 13, the protrusion portion of the source line 15a functioning as the source electrode is formed per pixel. On the other hand, in the TFT array substrate 20g of the present embodiment, as shown in FIG. 15, two protrusion portions of the source line 15a functioning as the source electrode are formed per pixel, and the floating electrode 15d is formed so as to face the protrusion portions of the source line 15a. Note that, in the repairing step, as shown in FIG. 16, similarly to the sixth embodiment, the overlap portion X3 between the part of the gate line 12a and the drain electrode 15b, and the overlap portion X4 between the part of the gate line 12a and the floating electrode 15d, Y7 and Y8 of the gate line 12a, and the position Y6 of the drain electrode 15b, each being situated in the TFT 5 of the defective pixel, should be subjected to laser radiation.

In the embodiments described above, while the explanation has been given of the exemplarily method in which the dynamic operating inspection is carried out to the target object in the stage of being a liquid crystal display panel, and thereafter the defect repair is carried out to the target object in the stage of being the liquid crystal display panel. However, the present invention may be carried out in a manner in which the inspection is carried out to each TFT array substrate fabricated in the TFT array substrate fabricating step using a CCD (charge coupled device) camera or the like for detecting any TFT whose source electrode 15a and drain electrode 15b are short-circuited, and thereafter the defect repair is carried out to the target object in the stage of being the TFT array substrate.

In the embodiments described above, while the explanation has exemplarily been given of the exemplarily liquid crystal display panel as the display panel, the present invention is applicable also to other display panels such as an EL (electroluminescence) display panel that includes a TFT array substrate.

In the embodiments described above, while the explanation has exemplarily been given of the liquid crystal display panel of the vertical alignment type, the present invention is applicable also to a liquid crystal display panel of the horizontal alignment type.

INDUSTRIAL APPLICABILITY

The present invention is capable of repairing a short-circuit established at the source electrode and the drain electrode of each TFT while suppressing a reduction in the aperture ratio to the minimum possible, as described in the foregoing. Therefore, it is useful for a TFT array substrate that includes a plurality of TFT per pixel, and a liquid crystal display panel comprising the same.

DESCRIPTION OF REFERENCE CHARACTERS

E Protrusion Portion
S1-S3 Slit
Z Short-circuit Portion
5 TFT (Switching Element)
12a Gate Line (Gate Electrode)
13 Gate Insulating Film
14a Semiconductor Layer (First Semiconductor Portion)
14b Semiconductor Layer (Second Semiconductor Portion)
14c Semiconductor Layer
15a Source Line (Source Electrode)
15b Drain Electrode
15c Bypass Wiring (Conductive Portion)
15d Floating Electrode (Conductive Portion)
17 Pixel Electrode
20a-20g TFT Array Substrate
30 Counter Substrate
40 Liquid Crystal Layer (Display Medium Layer)
50 Liquid Crystal Display Panel

The invention claimed is:

1. A thin film transistor array substrate, comprising:
a plurality of pixel electrodes arranged in a matrix pattern:
a plurality of source lines arranged to extend in parallel to one another and each arranged between the pixel electrodes;
a plurality of gate lines arranged to extend in parallel to one another and in a direction crossing the source lines; and
a plurality of thin film transistors respectively provided per each of intersections of the gate lines and the source lines, wherein
the thin film transistors each include: a gate electrode connected to corresponding one of the gate lines; a first semiconductor portion formed to be island-shaped and to overlap the gate electrode having a gate insulating film interposed therebetween; a source electrode arranged to overlap the gate electrode having the gate insulating film and the first semiconductor portion interposed therebetween and connected to corresponding one of the source lines, a drain electrode arranged to overlap the gate electrode having the gate insulating film and the first semiconductor portion interposed therebetween and connected to corresponding one of the pixel electrodes; a second semiconductor portion formed to be island-shaped between the gate insulating film and the source electrode so as to overlap the gate electrode, and a conductive portion arranged to overlap the gate electrode having the gate insulating film and the second semiconductor portion interposed therebetween, and wherein
the thin film transistors are each configured such that, when a short-circuit portion is formed by a short-circuit established at the source electrode and the drain electrode, the source line connected to the source electrode and the pixel electrode connected to the drain electrode are brought into conduction by a switching element including the short-circuit portion, the second semiconductor portion and the conductive portion.

2. The thin film transistor array substrate of claim 1, wherein
the conductive portion is a bypass wiring arranged for each of the source lines per each of the intersections of the gate lines and the source lines, and extends along each of the source lines.

3. The thin film transistor array substrate of claim 2, wherein
a channel width and a channel length of the first semiconductor portion defined by the source electrode and the drain electrode are set to be equal to a channel width and a channel length of the second semiconductor portion defined by the source electrode and the bypass wiring.

4. The thin film transistor array substrate of claim 2, wherein
the gate electrode is structured with part of the corresponding one of the gate lines, and the corresponding one of the gate lines is provided with a slit formed around the source electrode and the drain electrode.

5. The thin film transistor array substrate of claim 2, wherein
the gate electrode has a protrusion portion in which the corresponding one of the gate lines is protruding sideways, and
the source electrode and the drain electrode are arranged so as to overlap the protrusion portion.

6. The thin film transistor array substrate of claim 1, wherein
the conductive portion is a floating electrode arranged per each of the intersections of the gate lines and the source lines, and extends along the source electrode, and
the gate electrode is structured with part of the corresponding one of the gate lines, and the corresponding one of the gate lines is provided with a slit formed so as to cross the drain electrode and the floating electrode.

7. A display panel, comprising:
the thin film transistor array substrate of claim 1;
a counter substrate disposed to oppose to the thin film transistor array substrate; and
a display medium layer arranged between the thin film transistor array substrate and the counter substrate.

8. A method for manufacturing a thin film transistor array substrate, the thin film transistor array substrate including:
a plurality of pixel electrodes arranged in a matrix pattern;
a plurality of source lines arranged to extend in parallel to one another and each arranged between the pixel electrodes;
a plurality of gate lines arranged to extend in parallel to one another and in a direction crossing the source lines; and a plurality of thin film transistors respectively provided per each of intersections of the gate lines and the source lines, wherein the thin film transistors each include: a gate electrode connected to corresponding one of the gate lines; a first semiconductor portion formed to be island-shaped and to overlap the gate electrode having a gate insulating film interposed therebetween; a source electrode arranged to overlap the gate electrode having the gate insulating film and the first semiconductor portion interposed therebetween and connected to corresponding one of the source lines; a drain electrode arranged to overlap the gate electrode having the gate insulating film and the first semiconductor portion interposed therebetween and connected to corresponding one of the pixel electrodes; a second semiconductor portion formed to be island-shaped between the gate insulating film and the source electrode so as to overlap the gate electrode; and a conductive portion arranged to overlap the gate electrode having the gate insulating film and the second semiconductor portion interposed therebetween, the method comprising:

an inspecting step of detecting, out of the plurality of thin film transistors, a thin film transistor in which a short-circuit portion is formed by a short-circuit established at the source electrode and the drain electrode; and a repairing step being carried out for the thin film transistor upon detection of the short-circuit portion in the inspecting step, by bringing the source line connected to the source electrode and the pixel electrode connected to the drain electrode into conduction by a switching element including the short-circuit portion, the second semiconductor portion and the conductive portion.

9. The method for manufacturing a thin film transistor array substrate of claim 8, wherein the conductive portion is a bypass wiring arranged for each of the source lines per each of the intersections of the gate lines and the source lines, and extends along each of the source lines, and in the repairing step, by subjecting the source line connected to the thin film transistor to laser radiation, a duplicately disposed portion of the source line with respect to the bypass wiring is separated.

10. The method for manufacturing a thin film transistor array substrate of claim 9, wherein the gate electrode is structured with part of the corresponding one of the gate lines, and the corresponding one of the gate lines is provided with a slit formed around the source electrode and the drain electrode, and in the repairing step, by subjecting an overlap portion between the source electrode and the gate line and an overlap portion between the drain electrode and the gate line in the thin film transistor to laser radiation, the source electrode and the gate line are connected each other, and the drain electrode and the gate line are connected to each other, and by subjecting a portion between the slit and a side edge of the gate line to laser radiation, the part of the gate line between the slit and the side edge of the gate line is separated.

11. The method for manufacturing a thin film transistor array substrate of claim 9, wherein the gate electrode has a protrusion portion in which the corresponding one of the gate lines is protruding sideways, the source electrode and the drain electrode are arranged so as to overlap the protrusion portion, and in the repairing step, by subjecting a base portion of the protrusion portion in the thin film transistor to laser radiation, the protrusion portion is separated.

12. The method for manufacturing a thin film transistor array substrate of claim 8, wherein the conductive portion is a floating electrode arranged per each of the intersections of the gate lines and the source lines, and extends along the source electrode, the gate electrode is structured with part of the corresponding one of the gate lines, and the corresponding one of the gate lines is provided with a slit formed so as to cross the drain electrode and the floating electrode, and in the repairing step, in the thin film transistor, by subjecting the drain electrode to laser radiation via the slit, the drain electrode is cut; by subjecting a portion between the slit and a side edge of the gate line, the part of the gate line between the slit and the side edge of the gate line is separated; and by subjecting an overlap portion between the separated gate line and the floating electrode and an overlap portion between the separated gate line and the drain electrode to laser radiation, the separated gate line and the floating electrode are connected to each other, and the separated gate line and the cut drain electrode are connected to each other.

* * * * *